(12) United States Patent
Huggett

(10) Patent No.: US 12,067,696 B2
(45) Date of Patent: Aug. 20, 2024

(54) IMAGE SENSORS WITH VARIABLE RESOLUTION IMAGE FORMAT

(71) Applicant: SEMICONDUCTOR COMPONENTS INDUSTRIES, LLC, Phoenix, AZ (US)

(72) Inventor: Anthony Richard Huggett, Tadley (GB)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 422 days.

(21) Appl. No.: 17/647,870

(22) Filed: Jan. 13, 2022

(65) Prior Publication Data

US 2022/0261963 A1 Aug. 18, 2022

Related U.S. Application Data

(60) Provisional application No. 63/200,127, filed on Feb. 16, 2021.

(51) Int. Cl.
*G06T 3/4092* (2024.01)
*H01L 27/146* (2006.01)
*H04N 23/45* (2023.01)
*H04N 25/44* (2023.01)

(52) U.S. Cl.
CPC .......... *G06T 3/4092* (2013.01); *H04N 23/45* (2023.01); *H04N 25/44* (2023.01); *H01L 27/14609* (2013.01)

(58) Field of Classification Search
CPC ......... G06T 3/4092; G06T 3/40; H04N 23/45; H04N 25/44; H04N 19/14; H04N 19/17; H04N 25/79; H04N 19/124; H04N 7/122; H04N 19/59; H04N 19/70; H01L 27/14609
See application file for complete search history.

(56) References Cited

U.S. PATENT DOCUMENTS

| | | | | |
|---|---|---|---|---|
| 5,262,871 A | * | 11/1993 | Wilder | H04N 25/76 348/E3.018 |
| 6,144,772 A | * | 11/2000 | Garland | G06T 9/007 382/131 |
| 2011/0285866 A1 | | 11/2011 | Bhrugumalla et al. | |
| 2012/0039547 A1 | | 2/2012 | Gerhrd et al. | |
| 2013/0070109 A1 | | 3/2013 | Gove et al. | |
| 2014/0313316 A1 | | 10/2014 | Olsson et al. | |

* cited by examiner

*Primary Examiner* — Seung C Sohn
(74) *Attorney, Agent, or Firm* — Treyz Law Group, P.C.; Jason Tsai

(57) ABSTRACT

A system is provided that is configured to encode an image in accordance with a variable resolution image format. The variable resolution image format allows the specification of a number of windows in terms of their location and resolution. The image can be decomposed into a minimum number of square superpixels such that all specified windows are at the assigned resolution or better. By encoding one image where only critical portions are at the high resolution while less critical portions are at intermediate or lower resolutions, the number of bits that need to be transmitted from the system to a remote host subsystem can be dramatically reduced.

25 Claims, 11 Drawing Sheets

FIG.6

HORIZONTAL SCALE SELECTION FOR $l = 5$ $(00101_b)$, $r = 27$ $(11011_b)$

| x (dec) | 0 | 1 | 2 | 3 | 4 | 5 | 6 | 7 |
|---|---|---|---|---|---|---|---|---|
| x (bin) | 00000 | 00001 | 00010 | 00011 | 00100 | 00101 | 00110 | 00111 |
| $s_x$ | 2 | 2 | 2 | 2 | 0 | 0 | 0 | 0 |

| x (dec) | 8 | 9 | 10 | 11 | 12 | 13 | 14 | 15 |
|---|---|---|---|---|---|---|---|---|
| x (bin) | 01000 | 01001 | 01010 | 01011 | 01100 | 01101 | 01110 | 01111 |
| $s_x$ | 0 | 0 | 0 | 0 | 0 | 0 | 0 | 0 |

| x (dec) | 16 | 17 | 18 | 19 | 20 | 21 | 22 | 23 |
|---|---|---|---|---|---|---|---|---|
| x (bin) | 10000 | 10001 | 10010 | 10011 | 10100 | 10101 | 10110 | 10111 |
| $s_x$ | 0 | 0 | 0 | 0 | 0 | 0 | 0 | 0 |

| x (dec) | 24 | 25 | 26 | 27 | 28 | 29 | 30 | 31 |
|---|---|---|---|---|---|---|---|---|
| x (bin) | 11000 | 11001 | 11010 | 11011 | 11100 | 11101 | 11110 | 11111 |
| $s_x$ | 0 | 0 | 0 | 0 | 2 | 2 | 2 | 2 |

FIG.10

VERTICAL SCALE SELECTION FOR $t = 3$ ($00011_b$), $b = 17$ ($10001_b$)

| y (dec) | 0 | 1 | 2 | 3 | 4 | 5 | 6 | 7 |
|---|---|---|---|---|---|---|---|---|
| y (bin) | 00000 | 00001 | 00010 | 00011 | 00100 | 00101 | 00110 | 00111 |
| $s_y$ | 1 | 1 | 0 | 0 | 0 | 0 | 0 | 0 |

| y (dec) | 8 | 9 | 10 | 11 | 12 | 13 | 14 | 15 |
|---|---|---|---|---|---|---|---|---|
| y (bin) | 01000 | 01001 | 01010 | 01011 | 01100 | 01101 | 01110 | 01111 |
| $s_y$ | 0 | 0 | 0 | 0 | 0 | 0 | 0 | 0 |

| y (dec) | 16 | 17 | 18 | 19 | 20 | 21 | 22 | 23 |
|---|---|---|---|---|---|---|---|---|
| y (bin) | 10000 | 10001 | 10010 | 10011 | 10100 | 10101 | 10110 | 10111 |
| $s_y$ | 0 | 0 | 1 | 1 | 2 | 2 | 2 | 2 |

F<small>IG</small>.11

IMAGE SENSORS WITH VARIABLE RESOLUTION IMAGE FORMAT

BACKGROUND

This relates generally to imaging systems, and more specifically, to imaging systems configured to transmit video images having portions of varying resolutions.

Modern electronic devices such as cellular telephones, cameras, and computers often include image sensors. Automotive and other applications use high-resolution digital cameras to capture images. Typically, the captured images are transmitted to an electronic control unit or other electronic computing system for processing. High-resolution imaging applications, however, impose higher bandwidth requirements than lower-resolution imaging applications.

Bandwidth requirements can be reduced by transmitting small regions of a captured image at a fixed high resolution or transmitting a captured image in its entirety at a fixed low resolution, but not both. In addition, these systems generally do not have the capability to decode both the entire image capture and desired regions within the image capture. In the absence of such capabilities, significant bandwidth is required. It is within this context that the embodiments herein arise.

BRIEF DESCRIPTION OF THE DRAWINGS

FIG. 6 is a diagram showing an illustrative order for transmitting superpixels in accordance with some embodiments.

FIGS. 9-11 are diagrams showing how superpixels relative to a window of interest can be scaled in accordance with some embodiments.

DETAILED DESCRIPTION

The apparatus according to various aspects of the present disclosure may be used in conjunction with any suitable imaging system, such as a camera system, video system, machine vision system, vehicle navigation system, surveillance system, motion detection system, image stabilization system, advanced driver assist system (ADAS), and the like. Various representative implementations of the present technology may be applied, for example, to any image sensor, imaging device, pixel array, and the like.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1A:
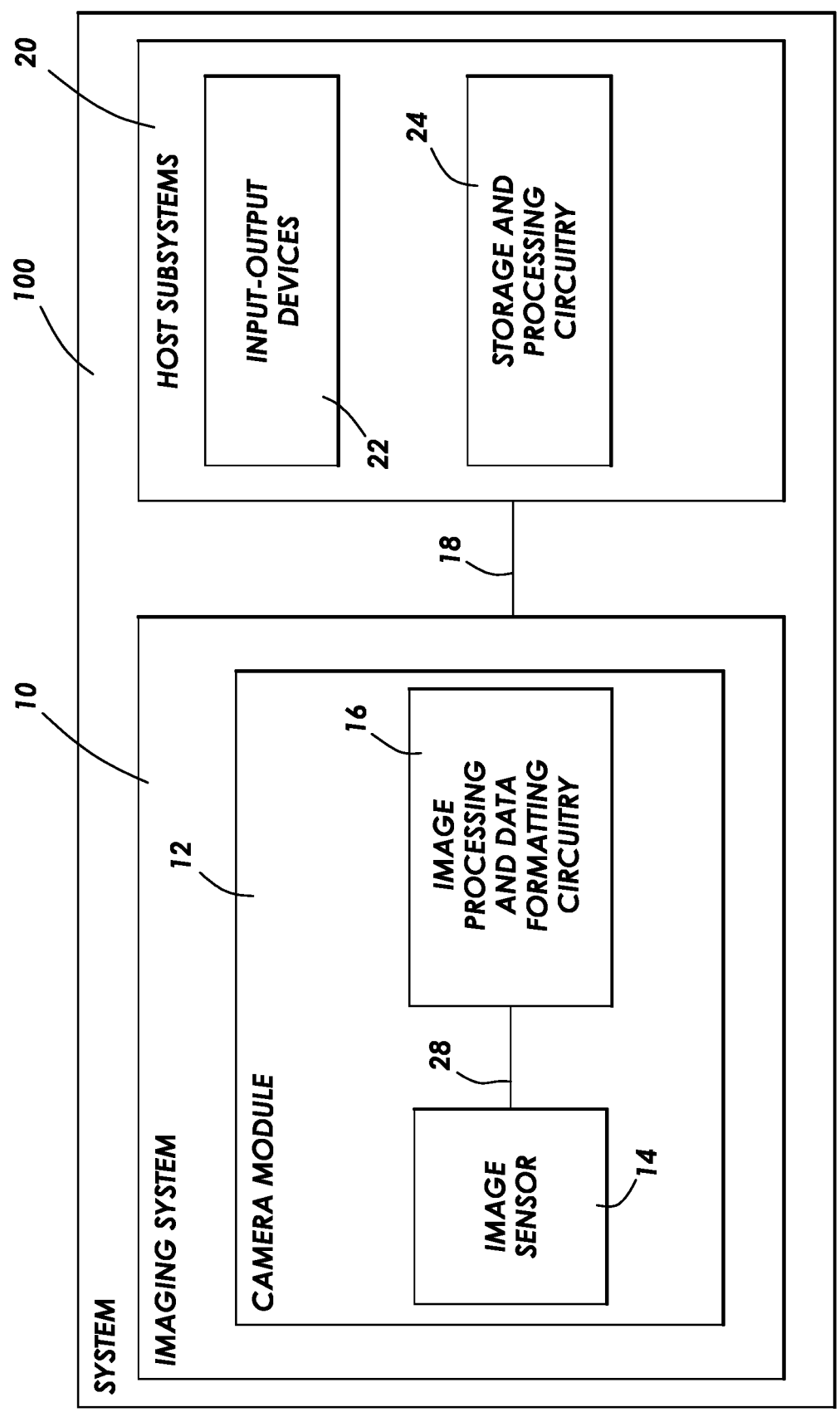
FIG. 1A is a diagram of an illustrative electronic device having an image sensor in accordance with some embodiments.

FIG. 1A is a diagram of an illustrative imaging and response system including an imaging system that uses an image sensor to capture images. System 100 of FIG. 1A may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1A, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

As an example, in a vehicle safety system, information from imaging system 10 may be used by the vehicle safety system to determine environmental conditions surrounding the vehicle. As examples, vehicle safety systems may include systems such as a parking assistance system, an automatic or semi-automatic cruise control system, an auto-braking system, a collision avoidance system, a lane keeping system (sometimes referred to as a lane-drift avoidance system), a pedestrian detection system, etc. In at least some instances, system 100 may form part of a semi-autonomous or autonomous self-driving vehicle.

Figure 1B:
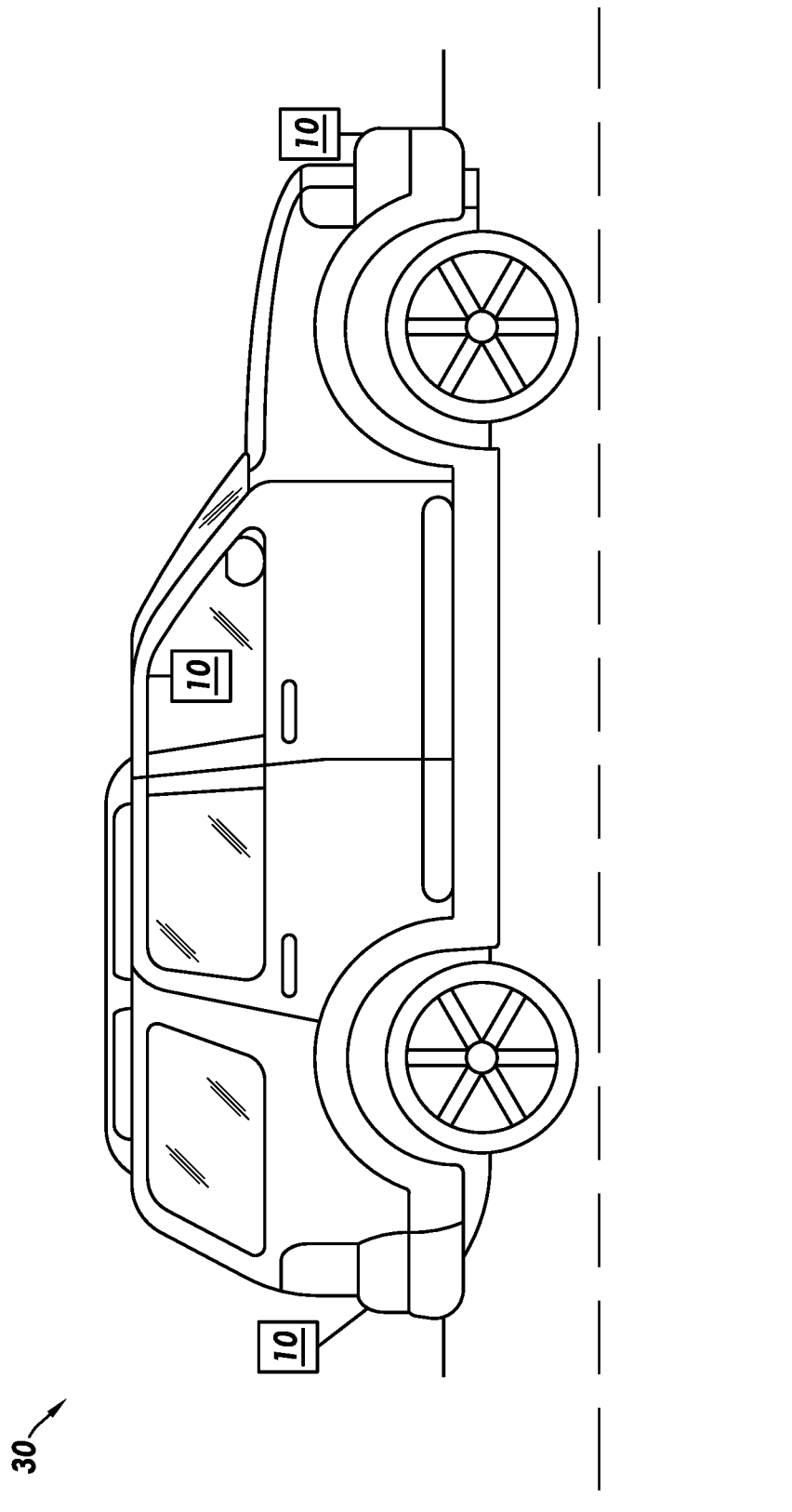
FIG. 1B is a diagram of an illustrative vehicle having multiple imaging systems in accordance with some embodiments.

An illustrative example of a vehicle such as an automobile 30 is shown in FIG. 1B. As shown in the illustrative example of FIG. 1B, automobile 30 may include one or more imaging systems 10. The imaging systems 10 may form at least part of a vehicular safety system 100 as discussed above Imaging systems 10 may be devices or systems with dedicated image capture and/or image processing functions. If desired, an imaging system 10 may perform some or all of the image processing functions associated with a given driver assist operation. A dedicated driver assist processor (e.g., storage and processing circuitry 24 in FIG. 1A) may receive signals from imaging system 10. While various imaging systems 10 can be placed at different locations within automobile 30, host subsystem 20 can be disposed at a central location within automobile 30 (e.g., near the engine bay).

In another suitable example, an imaging system 10 may perform only some or none of the image processing operations associated with a given driver assist function. For example, imaging system 10 may merely capture images of the environment surrounding the vehicle 30 and transmit the image data to processing circuitry 24 for further processing. Such an arrangement may be used for vehicle safety system functions that require large amounts of processing power and memory (e.g., full-frame buffering and processing of captured images).

In the illustrative example of FIG. 1B, a first imaging system 10 is shown mounted on the front of car 30 (e.g., to capture images of the surroundings in front of the car), and a second imaging system 10 is shown mounted in the interior of car 30 (e.g., to capture images of the driver of the vehicle). If desired, an imaging system 10 may be mounted at the rear end of vehicle 30 (i.e., the end of the vehicle opposite the location at which first imaging system 10 is mounted in FIG. 1B). The imaging system at the rear end of the vehicle may capture images of the surroundings behind the vehicle. These examples are merely illustrative. One or more imaging systems 10 may be mounted on or within a vehicle 30 at any desired location(s).

Figure 2:
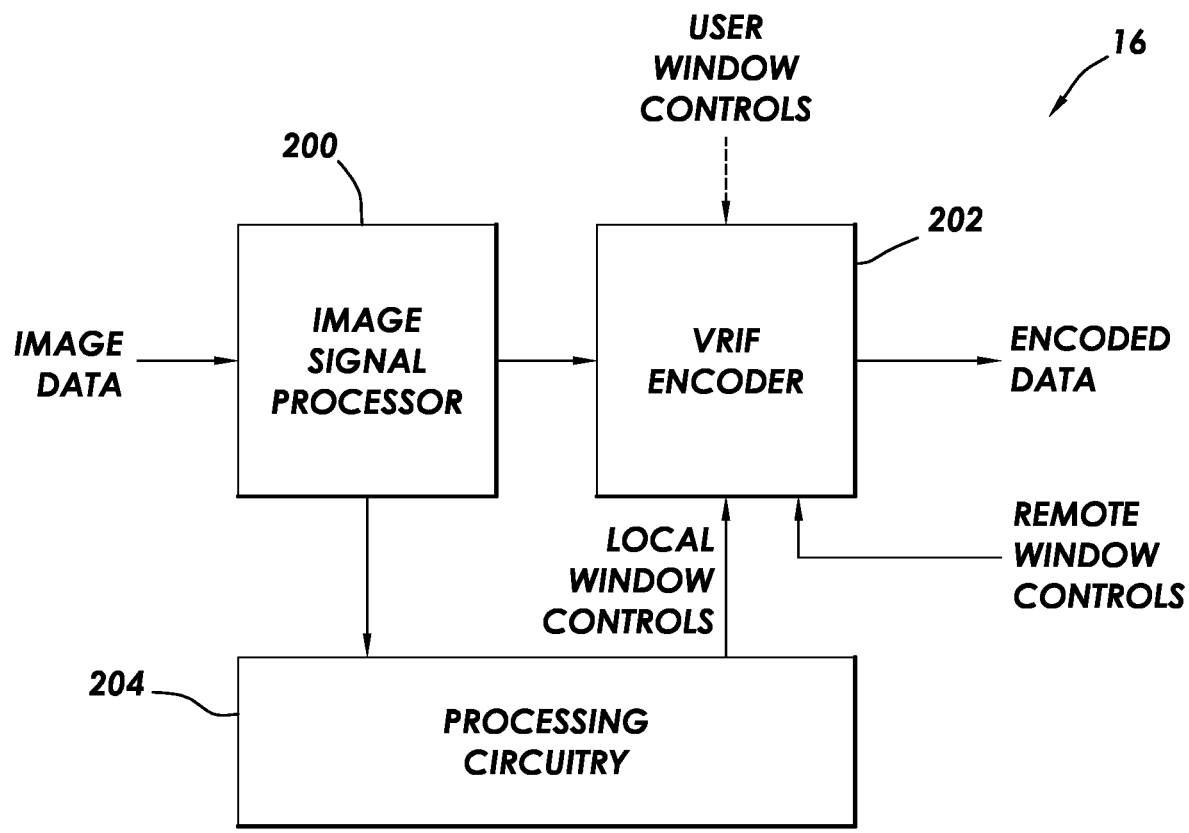
FIG. 2 is a diagram of an image processing/readout die in accordance with some embodiments.

In accordance with an embodiment, imaging system 10 may be configured to generate a variable resolution image from a captured source image. FIG. 2 is a diagram of illustrative circuit blocks within image processing and data formatting circuitry 16. As shown in FIG. 2, circuitry 16 may include an image signal processor 200, a variable resolution image format (VRIF) encoding circuit such as VRIF encoder 202, and associated processing circuitry 204. Image signal processor 200 may include any number of devices and/or subsystems for performing calculations and transmitting and receiving image/video data from an image sensor die 14. Image signal processor 200 may perform various digital signal processing functions such as color interpolation, color correction, facilitate auto-focus, exposure adjustment, noise reduction, video image stabilization, white balance adjustment, compression, and the like. Processing circuitry 204 locally detects regions of the image that should be transmitted at higher resolutions. For example, processing circuitry 204 may be configured to analyze the image data, to identify regions of the image that include objects moving towards the image sensor, and to select those regions as being part of one or more higher resolution windows. If desired, downstream circuitry such as storage and processing circuitry 24 within host subsystems 20 can also be used to detect areas of interests and to feed back window control information during the next frame.

Figure 3:
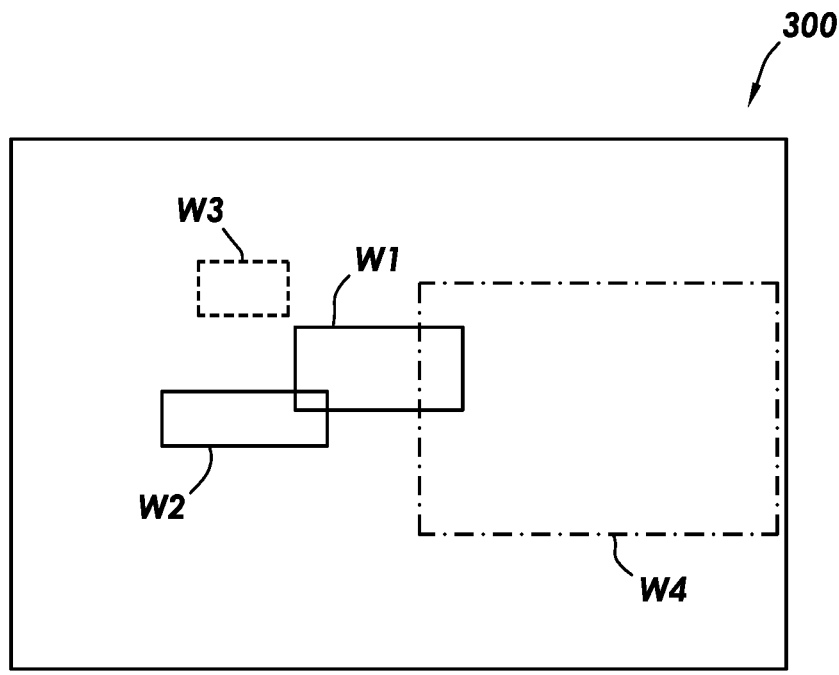
FIG. 3 is a diagram of an illustrative image divided into regions (windows) of different resolutions in accordance with some embodiments.

The image data that has been processed by image signal processor 200 may then be conveyed to VRIF encoder 202. VRIF encoder 202 receives the arriving (source) image data and defines a variable resolution image format whereby the whole image is transmitted but the resolution across the image can vary. The output of encoder 202 having the redefined variable resolution image format is sometimes referred to as the encoded data. FIG. 3 illustrates an image 300 having the variable resolution image format. As shown in FIG. 3, image 300 (sometimes referred to as a variable resolution image) can have multiple regions or windows of interest such as windows W1, W2, W3, and W4.

The various variable resolution regions may be defined according to the particular application. For example, when used in an automobile equipped with an advanced driver assistance system, lane markers on the road and distant traffic directly in front of the automobile may be represented as a high-resolution region while the sky may be represented as a low-resolution region. Regions outside these windows may correspond to a lowest-demand region (e.g., sky) and have a low resolution. The low-resolution regions may have the lowest resolution possible. Regions defined by each of the windows can be higher-resolution regions (e.g., high-resolution regions, higher resolution regions, intermediate-resolution regions, or other regions having relatively higher resolution relative to the low-resolution regions). For instance, window W1 may correspond to a region where high resolution is demanded (e.g., distant road and/or vehicle traffic) while window W4 may correspond to a region where an intermediate resolution is demanded.

In general, windows W1-W4 can have the same higher resolution or different resolutions. Any plurality of windows can be partially overlapping (see, e.g., partially overlapping windows W1 and W2), completely overlapping (e.g., a smaller window is a subset of a larger window), or non-overlapping (see, e.g., non-overlapping windows W1 and W3). For overlapping regions, the highest demanded resolution should be used. As another example, the resolution of window W1 can be higher than that of windows W2-W4 (e.g., window W1 is assigned as the highest resolution region). As another example, the resolution of windows W1 and W2 can be the same while the resolution(s) of windows W3 and W4 can be lower than the resolution of windows W1 and W2. The example of FIG. 3 in which variable resolution image 300 has four windows of interest is merely illustrative. In general, image 300 can have any suitable number of windows (regions of interests) each having any desired resolution.

Referring back to FIG. 2, assignment, selection, and control of these windows can be received by VRIF encoder 202 locally from processing circuitry 204, remotely from host subsystem 20, from a user of system 100, or simply fixed. The encoded data can be conveyed to host subsystem 20 via data path 18 (see FIG. 1A). Host subsystem 20 may include a corresponding decoder for decoding the encoded data. If desired, the data received at host subsystem 20 may optionally be stored on storage and processing circuitry 24.

In accordance with an embodiment, image 300 can be divided into a number of square pixels (defined herein as "superpixels") such that all the demand windows are as the specified resolution or better. In other words, every pixel of image 300 is covered by one square superpixel. FIGS. 4A-4F are diagrams showing how an exemplary image can be divided into superpixels of different binning levels.

Figure 4A:
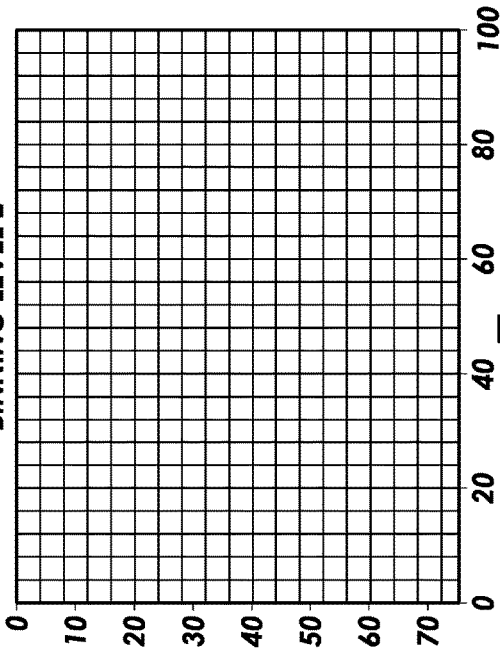
FIGS. 4A-4F are diagrams showing how an image can be divided into superpixels of different binning levels in accordance with some embodiments.
Figure 4B:
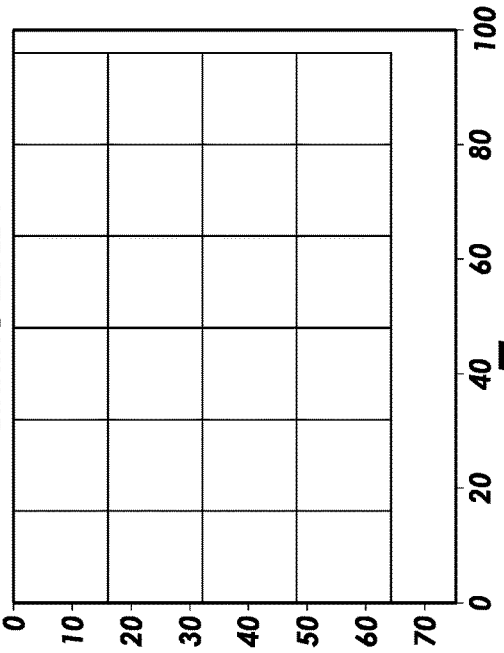
Figure 4C:
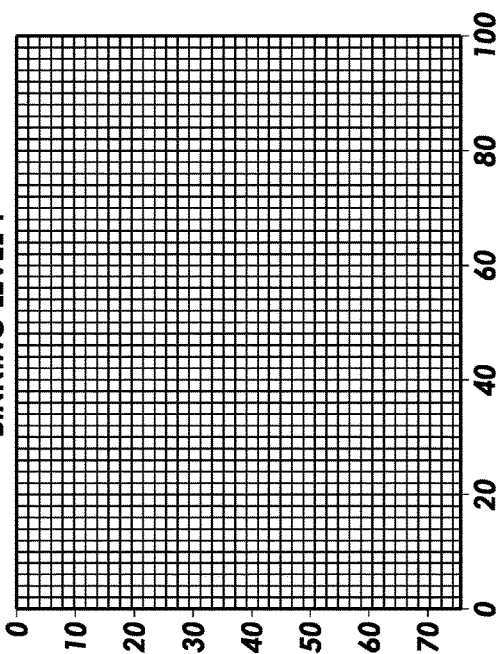
Figure 4D:
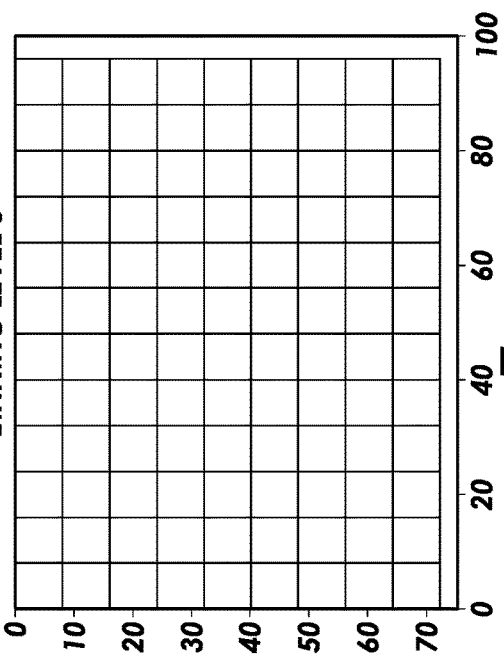
Figure 4F:
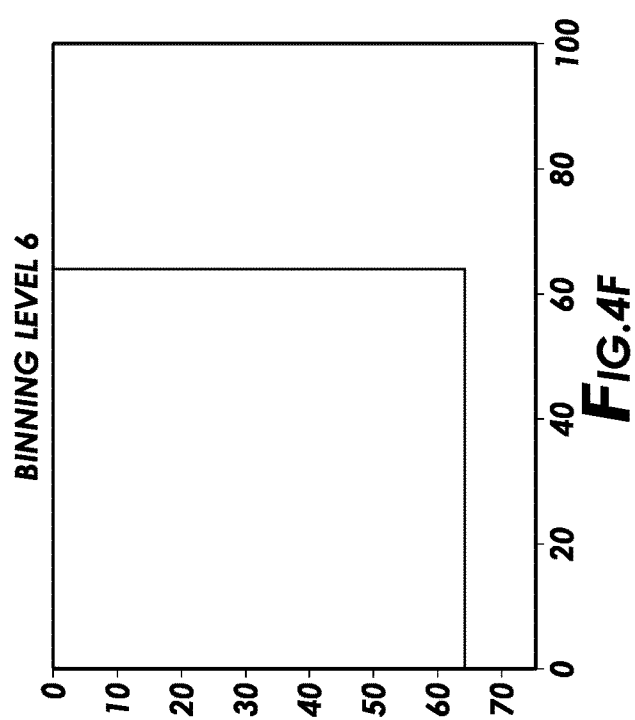
Figure 4E:
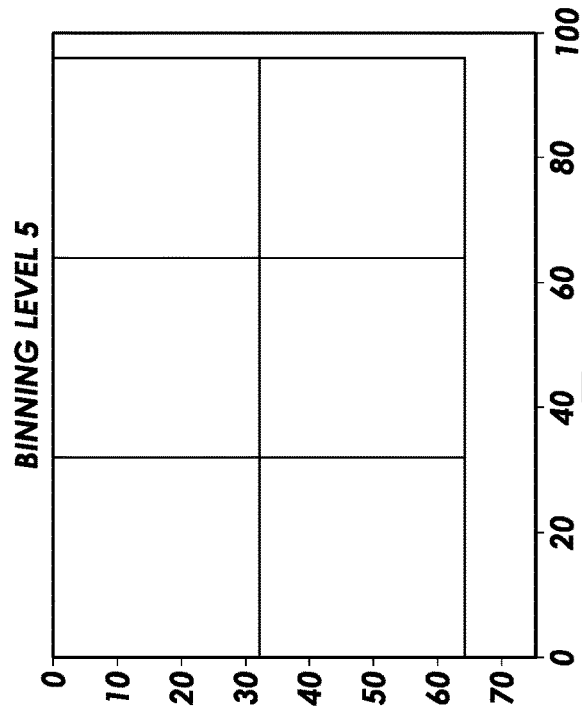

FIG. 4A shows an image being divided into 2×2 superpixels (i.e., each square superpixel covering 4 individual pixels), which corresponds to a binning level of one. FIG. 4B shows an image being divided into larger 4×4 superpixels (i.e., each square superpixel covering 16 individual pixels), which corresponds to a binning level of two. FIG. 4C shows an image being divided into even larger 8×8 superpixels (i.e., each square superpixel covering 64 individual pixels), which corresponds to a binning level of three. FIG. 4D shows an image being divided 16×16 superpixels (i.e., each square superpixel covering 256 individual pixels), which corresponds to a binning level of four. FIG. 4E shows an image being divided 32×32 superpixels (i.e., each square superpixel covering 1,024 individual pixels), which corresponds to a binning level of five. FIG. 4F shows an image being divided 64×64 superpixels (i.e., each square superpixel covering 4,096 individual pixels), which corresponds to a binning level of six. In general, superpixels of any size and any level of binning can be used. If desired, superpixels can be rectangular, hexagonal, or have other shapes. Note that all grids optionally start at the top left of the input image. Thus, a superpixel can be defined herein as a group of pixels corresponding to a particular binning (resolution) level.

The encoded data includes only superpixels. In other words, only superpixels are being output from VRIF encoder 202. Each superpixel only has one value (e.g., each superpixel is represented by one RGB triplet, YUV triplet, or other color pattern). Low resolution regions can be represented using the largest superpixels (e.g., 32×32 or 64×64 superpixels). Intermediate resolution regions can be represented using relatively smaller superpixels (e.g., 8×8 or 16×16 superpixels). High resolution regions can be represented using the smallest superpixels (2×2, 4×4, or even 1×1 superpixels). Since much of an image is typically covered by large superpixels (e.g., 32×32 or 64×64 superpixels) while only a small subset of the image lies within the higher resolution demand windows, transmitting only superpixels in this way can dramatically reduce the image bitstream that is transmitted from imaging system 10 to host subsystems 20. In other words, the important parts of the image are preserved with no compression while the less important parts of the image can be compressed to save bandwidth.

The embodiment above where each superpixel has one respective value is merely illustrative. In an alternative mode of operation, superpixels outside the demand windows need not be sent at all (i.e., no value is sent for superpixels outside the windows). Such mode of operation may be signaled to the decoder by, for example, setting the default resolution to zero (e.g., signaling a high resolution for the whole image) while specifying at least one demand window.

Figure 5:
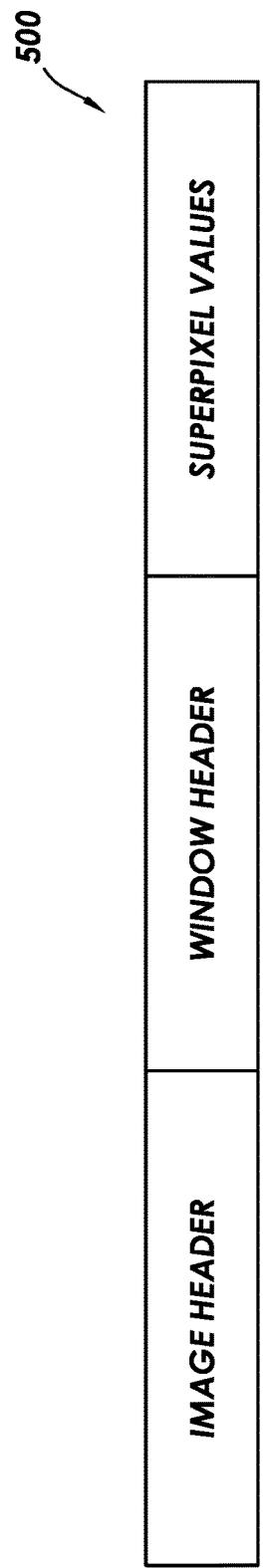
FIG. 5 is a diagram of a transmitted bitstream with a variable resolution image format in accordance with some embodiments.

FIG. 5 is a diagram of an image bitstream with the variable resolution image format. As shown in FIG. 5, image bitstream 500 can include an image header, a window header, and associated superpixel values. The image header may include information about the overall/native image size (X, Y), the color format, and a default resolution. The window header may include information about the number of windows N and attributes of each window (e.g., the scale/resolution, the location of the left edge, the location of the top edge, the location of the right edge, and the location of the bottom edge). The remaining pixel data in the bitstream specifies the value of each superpixel as defined by an RGB triplet, YUV triplet, Bayer quad, etc. In other words, the VRIF format specifies the number of windows in terms of their location and resolution. The sizes, positions, and order of all of the superpixels are implicit and thus not transmitted.

Figure 6:
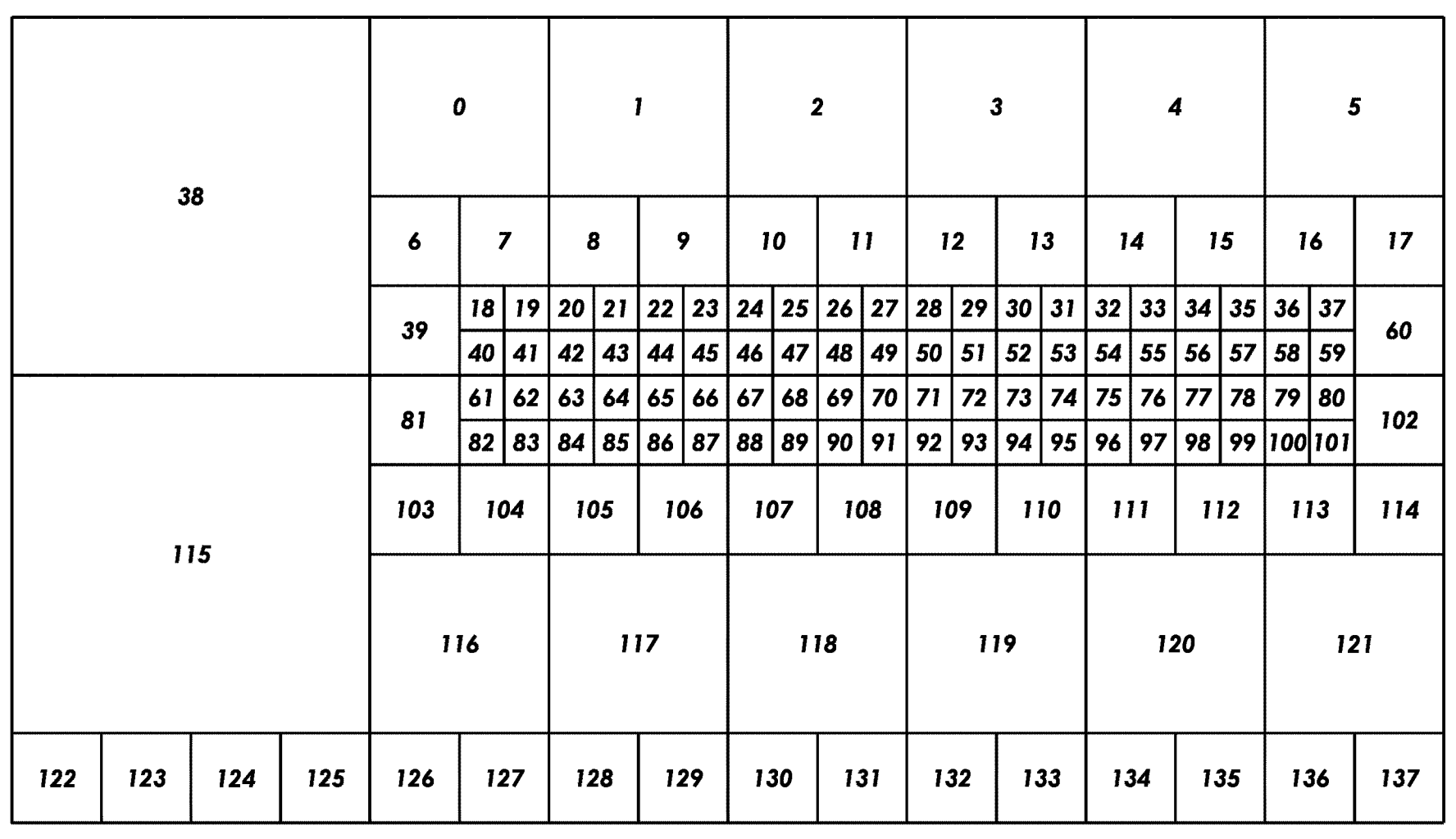

FIG. 6 is a diagram showing an illustrative order for transmitting superpixels as specified by the window header. The corresponding number in each superpixel indicates the order of transmission, starting with 0 and counting up. The order is defined by the arrival time of the final input pixel within each superpixel, which is located at the bottom right corner of each superpixel. As shown in FIG. 6, contiguous groups of superpixels can be transmitted sequentially in a row-wise fashion. In the example of FIG. 6, the largest superpixels are the $38^{th}$ and $115^{th}$ superpixels to be transmitted, whereas the smallest superpixels correspond to the $19:37^{th}$ superpixels to be transmitted, the $40:59^{th}$ superpixels to be transmitted, the $61:80^{th}$ superpixels to be transmitted, and the $82:101^{st}$ superpixels to be transmitted. Though we might choose any unambiguous order for the transmission of superpixels, the transmission order of FIG. 6 is advantageous because each superpixel value is used (i.e., output to the binning level selection circuit) or discarded as soon as it is produced by the downsampling logic circuitry 700. Thus, no buffer needs to exist between the downsampling logic circuitry 700 and the binning level selection circuit 704, thereby minimizing the area of encoder 202.

Figure 7:
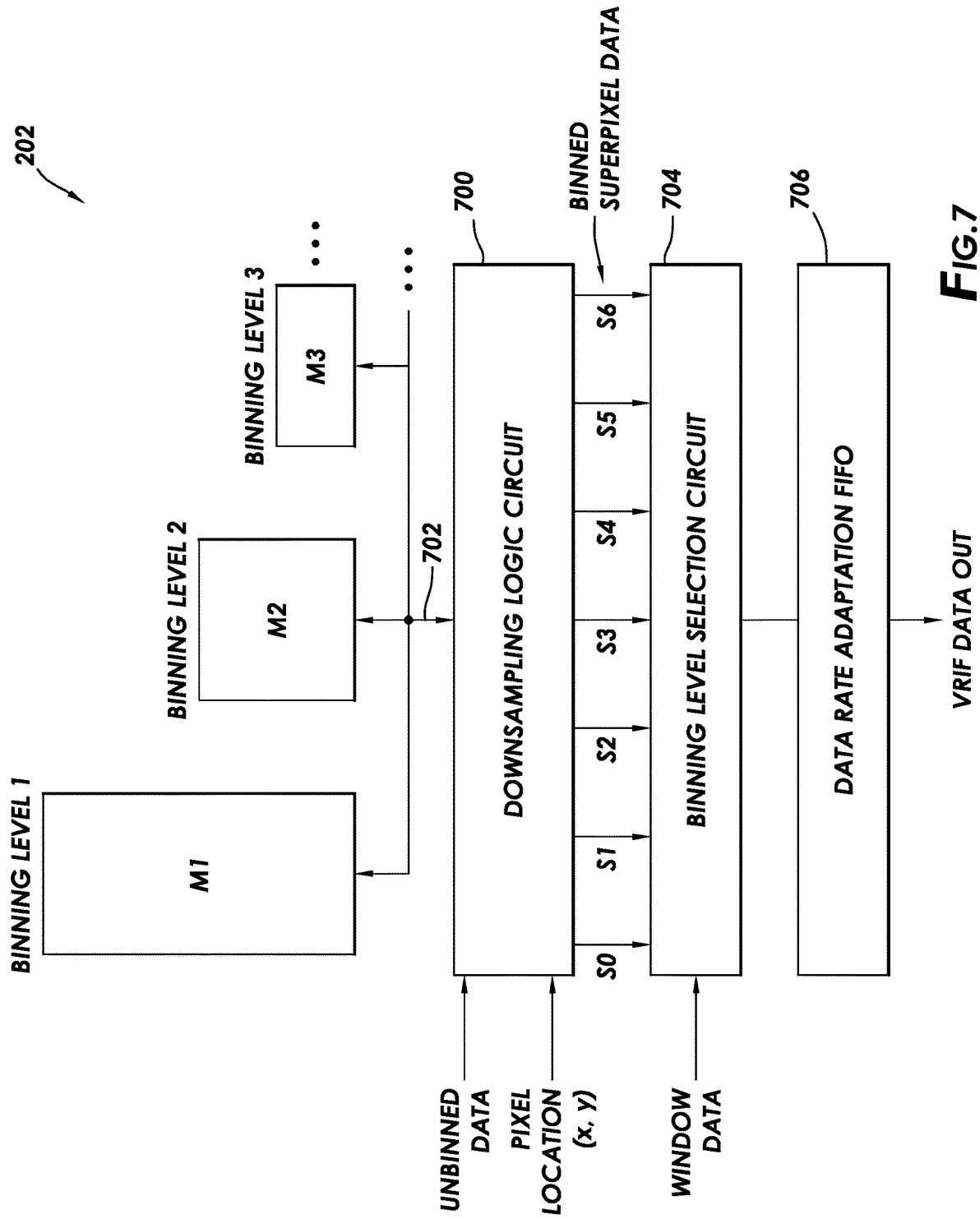
FIG. 7 is a diagram of an illustrative variable resolution image format encoder circuit in accordance with some embodiments.

FIG. 7 is a diagram of an illustrative variable resolution image format encoder 202. The variable resolution image may be represented by a multi-level image pyramid, where each level represents a varying resolution of the source image. As shown in FIG. 7, encoder 202 may include memory circuits (e.g., memory circuits M1, M2, M3, etc.), a logic circuit such as downsampling logic circuit 700, a selection circuit such as binning level selection circuit 704, and a buffer circuit such as data rate adaptation first-in-first-out (FIFO) circuit 706. Downsampling logic circuit 700 may receive unbinned image data values and associated pixel location (x, y) information and generate a corresponding multi-level image pyramid of binned data values.

Downsampling logic circuit 700 may be configured to perform various processing operations of the system, including the processing operations associated with generating a plurality of superpixel values. For instance, in response to receiving the unbinned data and pixel location information from image signal processor 200, downsampling logic circuit 700 may be configured to perform a plurality of binning operations over a number of processing cycles (e.g., a single binning operation may be performed per processing cycle, and each processing cycle may be triggered by a clock or any other suitable enabling signal). Downsampling logic circuit 700 may be configured to perform a binning operation on a first binning (resolution) level pixel group during a first processing cycle, where the first binning level pixel group is located in one of the low-resolution regions on the pixel array. Downsampling logic circuit 700 may perform the binning operation on the first binning level pixel group by, for example, summing the charges of each pixel within the first binning level pixel group. The first binning level pixel group may be a 4-pixel group, a 9-pixel group, or any other suitably sized pixel group, such that the pixel group forms a square (i.e., 2×2, 3×3, etc.).

Downsampling logic circuit 700 may be coupled to various memory circuits via bidirectional data path 702 to generate binned data values. The amount of memory allocated for generating the binned data values associated with each resolution level of the multi-level image pyramid may successively decrease, such that generating the binned pixel values associated with each resolution level requires less memory than the previous resolution level. For example, a first memory circuit M1 of the first binning level may be configured to store 2×1 sum results, where half of the line buffer is allocated for this first level of the image pyramid. A second memory circuit M2 of the second binning level may be configured to store 4×2 sum results, where one quarter of the line buffer is allocated for this second level of the image pyramid. A third memory circuit M3 of the third binning level may be configured to store 8×4 sum results, where one eight of the line buffer is allocated for this third level of the image pyramid, and so on. This particular memory allocation is analogous to a geometric series that converges absolutely (i.e., the sum converges to one). Accordingly, the entire multi-level image pyramid with all levels may be encoded using one line (or less) of memory, which requires a very small logic footprint. The sum results stored in the various memory circuits are sometimes referred to as horizontally binned pixel values and represent only a upper half of a superpixel. A horizontally binned pixel value can be defined herein as a sum result that combines values from pixels along the same row. The latter (bottom) half of the superpixel will be generated by downsampling logic circuit 700 in a subsequent cycle and added to the upper half to complete the superpixel. A superpixel is therefore sometimes referred to as a horizontally and vertically binned square pixel value. The complete superpixel data is immediately available to binning level selection circuit 704. At least some of the superpixel values can be selected for output to the binning level selection circuit 704. When a superpixel value is selected for output, it is appended to the VRIF data output bitstream as soon as the superpixel becomes available.

Memory circuits such as M1-M3 may comprise any suitable volatile memory, such as random-access memory, and the like, for storing binned pixel values generated during the binning operations. In various embodiments, a line buffer may be allocated in the memory and may have any suitable number of buffer allocations within the memory, such that each buffer allocation may correlate to one of the levels of the image pyramid (e.g., RAM capable of storing one line of pixels).

Downsampling logic circuit 700 may be further configured to output the sum of the charges from the first binning level pixel group in the form of a binned pixel (data) value. Binning level selection circuit 704 chooses the output scale for every binned pixel value and may optionally be configured to divide the binned pixel value by the chosen scale factor. Binning level selection circuit 704 may be implemented as a multiplexer (as an example). Downsampling logic circuit 700 may be further configured to repeat the same procedure multiple times over successive binning (resolution) levels until all of the pixel signals located in the specified low-resolution regions have been binned.

Each superpixel value may be determined according to its location and resolution, and the size of each superpixel value (and the scale factor) may be determined according to a variety of suitable factors, such as the size of the source image and the size of each window. The window data may include the size of the source image, default resolution, and the position and resolution of each window. For example, this may be done at the start of each frame of the source image. Each superpixel value may be associated with a respective scale factor. Each scale factor may be an adjustable parameter and may vary depending on the location of the superpixel value. For example, the scale factor associated with one superpixel value may have a ratio of two-to-one, while the scale factor associated with another superpixel value may have a ratio of four-to-one. It will be appreciated that the scale factor associated with one or more of the superpixel values may be significantly larger, such as eight-to-one, or sixteen-to-one.

Data output from binning level selection circuit 704 may be optionally conveyed to a data rate adaptation FIFO 706. Rate adaptation FIFO 706 may be configured to match the output data rate to a physical layer circuit at the input-output (IO) interface of circuitry 16. The bitstream output from rate adaptation FIFO 706 may be referred to as the VRIF data output stream. The VRIF data output stream can be transmitted from imaging system 10 to host subsystem 20 (see FIG. 1A). If desired, the VRIF data output stream can be stored in a file storage system on host subsystem 20. In scenarios where host subsystem 20 does not include any file storage, host subsystem 20 may simply process the received VRIF data on the fly and/or convey the data to other downstream components.

Figure 8:
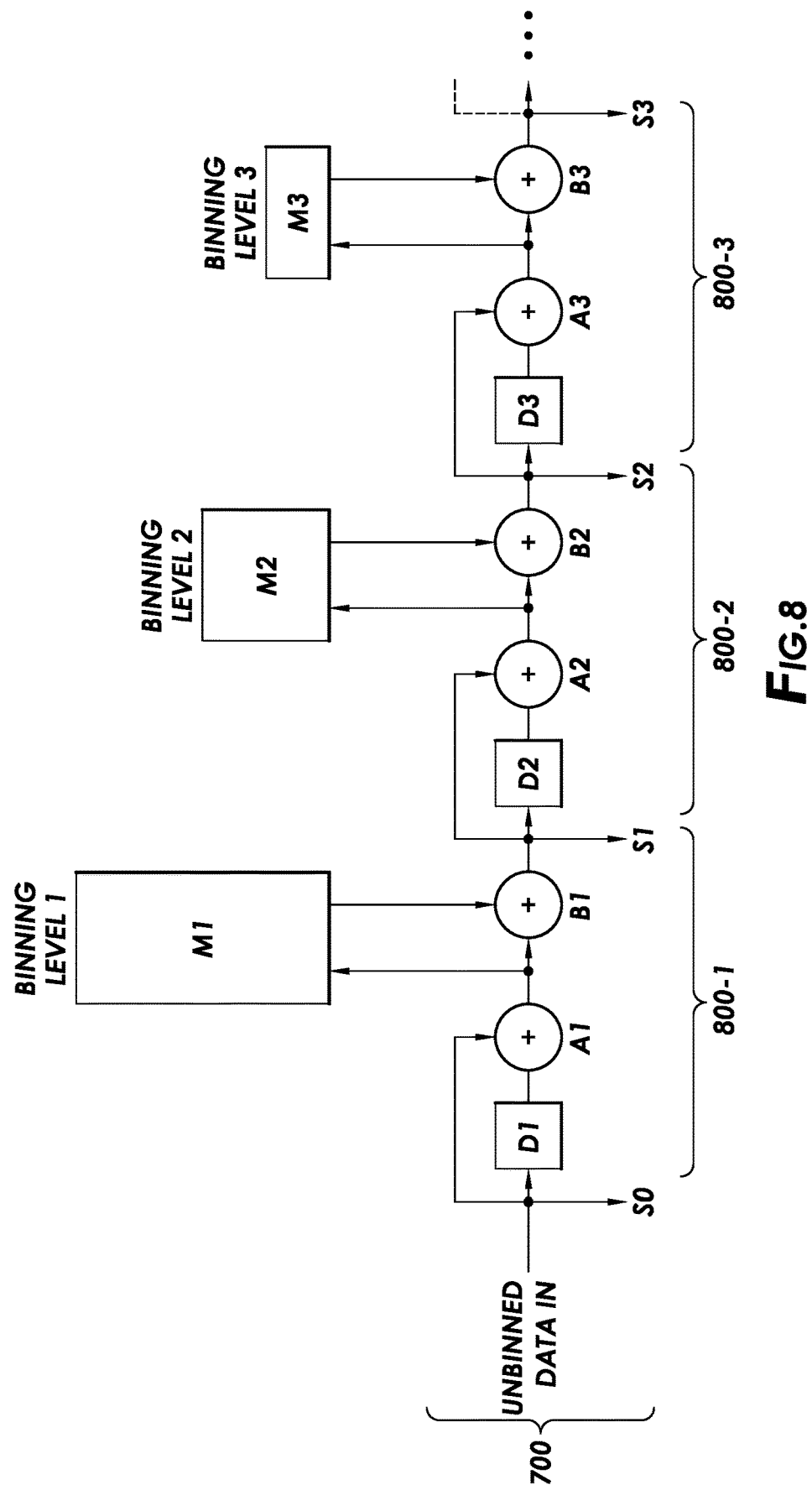
FIG. 8 is a diagram of illustrative downsampling logic circuitry in accordance with some embodiments.

FIG. 8 show one suitable implementation of downsampling logic circuit 700. As shown in FIG. 8, downsampling logic circuit 700 may include at least three sub-circuits such as a first logic sub-circuit 800-1, a second logic sub-circuit 800-2, and a third logic sub-circuit 800-3. First sub-circuit 800-1 may include delay circuit D1 and adder circuits A1, B1. Second sub-circuit 800-2 may include delay circuit D2 and adder circuits A2, B2. Third sub-circuit 800-3 may include delay circuit D3 and adder circuits A3, B3.

First sub-circuit 800-1 may be configured to receive unbinned pixel values from image signal processor 200 (see, e.g., FIG. 2). The unbinned pixel values may be output directly as values S0. First sub-circuit 800-1 may be further configured to perform various processing operations, such as the processing operations associated with generating a plurality of superpixel values associated with the first binning (resolution) level, sometimes referred to as binning level-1 superpixel values S1. First sub-circuit 800-1 may be further configured to transmit the level-1 superpixel values to second sub-circuit 800-2.

Second sub-circuit 800-2 may be configured to receive the superpixel values generated by first sub-circuit 800-1 and perform various processing operations, such as the processing operations associated with generating a plurality of superpixel values associated with the second binning (resolution) level, sometimes referred to as binning level-2 superpixel values S2. Second sub-circuit 800-2 may be further configured to transmit the level-2 superpixel values to third sub-circuit 800-3.

Third sub-circuit 800-3 may be configured to receive the superpixel values generated by second sub-circuit 800-2 and perform various processing operations, such as the processing operations associated with generating a plurality of superpixel values associated with the third binning (resolution) level, sometimes referred to as binning level-3 superpixel values S3.

Delay circuit D1 may be configured to delay the transmission of a pixel value associated with a pixel having an even index (e.g., pixel 0, pixel 2, etc.) until a subsequent pixel value (i.e., a value associated with a pixel having an odd index, e.g., pixel 1, pixel 3, etc.) is received by first sub-circuit 800-1. Delay circuit D2 may be configured to delay a transmission of a superpixel value associated with a superpixel having an even index until a subsequent superpixel value (i.e., a value associated with a superpixel having an odd index) is received from first sub-circuit 800-1. Delay circuit D3 may be configured to delay the transmission of a superpixel value associated with a superpixel having an even index until a subsequent superpixel value (i.e., a value associated with a superpixel having an odd index) is received from second sub-circuit 800-2.

Adder circuits A1, A2, A3, B1, B2, B3 may be configured to perform various processing operations of the system, including the processing operations associated with adding the pixels and/or pixel groups to each other. The adder circuits may comprise any circuit and/or system suitable for performing various calculations (e.g., addition, and the like), such as one or more logic circuits.

The example of FIG. 8 where downsampling logic circuit 700 includes at least three sub-circuits 800 coupled in a chain is merely illustrative. It will be appreciated that downsampling logic circuit 700 may include any number of logic sub-circuits, which may depend on the number of levels in the multi-level image pyramid. For example, in the case where the multi-level image pyramid has six levels, downsampling logic circuit 700 may include five logic sub-circuits connected in series. It will also be appreciated that each logic sub-circuit may include any suitable number of delay circuits and/or adder circuits, such that the memory requirements are minimized when the system is performing the binning operations.

As an example, downsampling logic circuit 700 may begin performing the binning operations by first receiving pixel data associated with the first row (i.e., row 0) of the source image. The value of pixel $P_{0,0}$ (i.e., the first pixel in row 0) may be received by first sub-circuit 800-1 and transmitted to adder circuit A1. Because pixel $P_{0,0}$ is a pixel with an even index, the transmission of its corresponding value may be delayed, via delay circuit D1, until the subsequent value of pixel $P_{0,1}$ (i.e., the second pixel in row 0) is received by the first sub-circuit.

Once the value of pixel $P_{0,1}$ is received by the first sub-circuit, it may be transmitted to adder circuit A1. The values of pixels $P_{0,0}$, $P_{0,1}$ may arrive at the adder circuit A1 at substantially the same time. Accordingly, the value of pixel $P_{0,0}$, may be added to the value of pixel $P_{0,1}$ using adder circuit A1. To reduce memory requirements, the resulting horizontally binned sum may be transmitted to the memory only when the first sub-circuit is performing such operations on pixel data associated with rows having even indices (e.g., row 0, row 2, etc.). Accordingly, because row 0 is a row with an even index, the resulting horizontally binned sum may be transmitted to the memory circuit M1 for temporary storage. This process may be repeated for the remaining pixel values associated with the first row (i.e., row 0) of the source image.

After all of the pixel values associated with the first row (i.e., row 0) of the source image have been received and processed by the first sub-circuit, the next row of pixels (e.g., row 1) may be transmitted to the first sub-circuit. For example, the value of pixel $P_{1,0}$ (i.e., the first pixel in row 1) may be received by the first sub-circuit and transmitted to adder circuit A1. Because pixel $P_{1,0}$ is a pixel with an even index, the transmission of its corresponding value may be delayed, via delay circuit D1, until the subsequent value of pixel $P_{1,1}$ (i.e., the second pixel in row 1) is received by the first sub-circuit. Once the value of pixel $P_{1,1}$ is received by the first sub-circuit, it may be transmitted to adder circuit A1. The values of pixels $P_{1,0}$, $P_{1,1}$ may arrive at adder circuit A1 at substantially the same time. Accordingly, the value of pixel $P_{1,0}$ may be added to the value of pixel $P_{1,1}$ using the adder circuit A1. The calculated sum may then be transmitted to adder circuit B1.

To reduce memory requirements, one of the horizontally binned sums that was written to M1 (i.e., stored in M1) during the previous binning operation (e.g., of row 0) may be read from M1 and added to the calculated sum only when the first sub-circuit is performing binning operations on rows with odd indices (i.e., row 1, row 3, etc.). Accordingly, because row 1 has an odd index, a horizontally binned sum that was written to M1 during the previous row operation (e.g., of row 0) may be read from M1 and added to the calculated horizontally binned sum via adder circuit B1 Image signal processor 200, which may be in communication with downsampling logic circuit 700, may specify which stored sum may be accessed from M1. Consequently, the resulting sum may be a 2×2 pixel group, which can be scaled down to form a single superpixel value. The resulting single superpixel value (sometimes referred to as a horizontally and vertically binned square pixel value) may then be transmitted to the binning level selection circuit and/or the second sub-circuit for further processing.

The second sub-circuit 800-2 may operate in a manner similar to that of the first sub-circuit. For example, the second sub-circuit may perform the same operations as described above on the superpixel values received from the first sub-circuit. Similarly, the third sub-circuit 800-3 may operate in a manner similar to that of the first and second sub-circuits. For example, the third sub-circuit may perform the same operations as described above on the superpixel values received from the second sub-circuit. The operations as described above may be repeated multiple times over successive resolution levels until all of the pixel signals located in the specified low-resolution regions have been binned.

Figure 9:
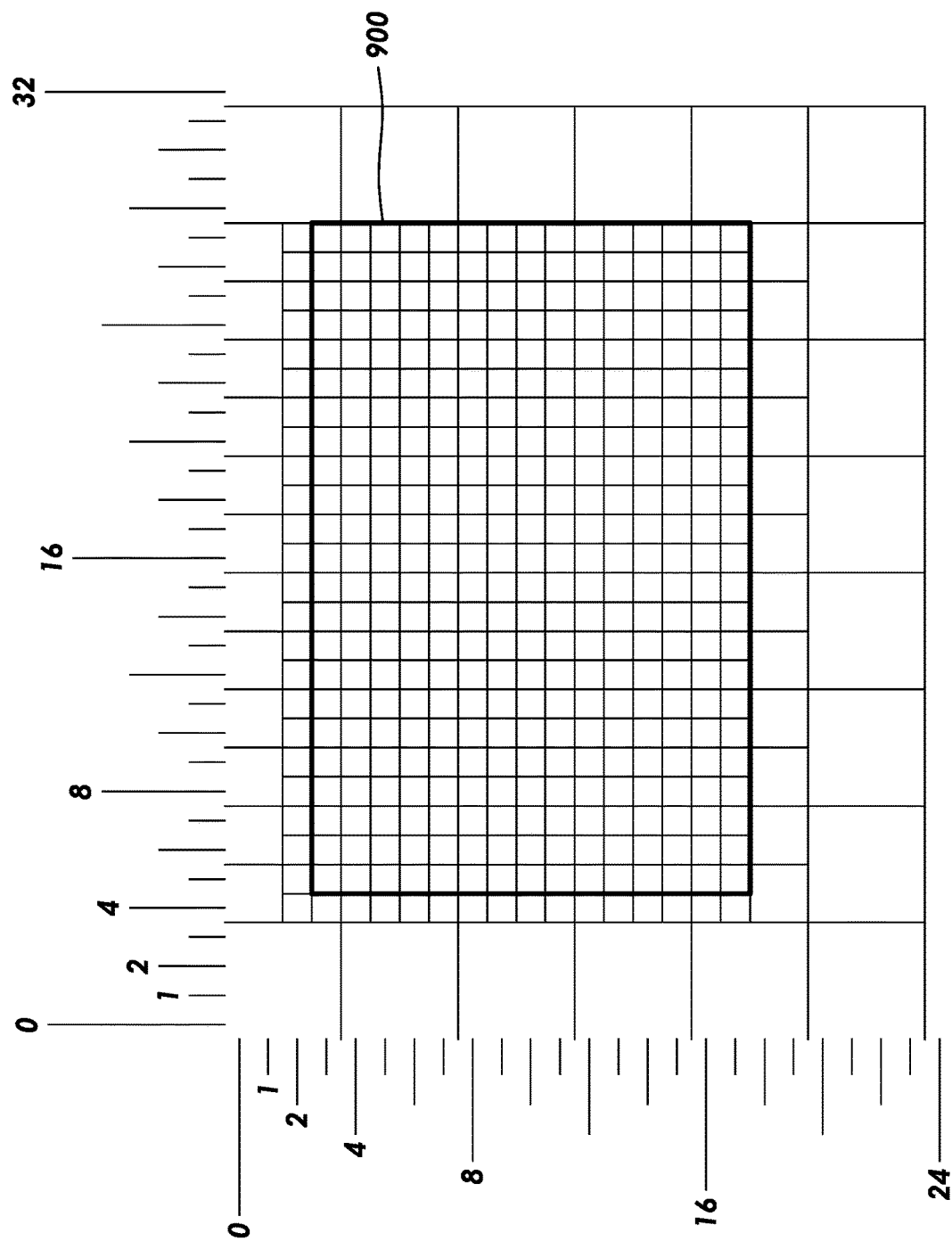

FIG. 9 is a diagram showing one window of interest (see window 900) within an exemplary image with 32×24 sizing. As shown in FIG. 9. Window 900 has a left window edge at pixel column index 5, a top window edge at pixel row index 3, a right window edge at pixel column index 27, and a bottom window edge at pixel row index 17. The system may perform a pixel decomposition scheme, where the area outside of the specified window(s) may be divided into a plurality of superpixels values of one or more sizes. In some embodiments, the size of each superpixel value located outside of the specified window(s) may be any suitable size, such as 2×2, 4×4, 8×8, etc. In other embodiments, the size of each superpixel value located outside of the specified window(s) may be as large as possible. In the example of FIG. 9, all superpixels inside window 900 may be designated a scale value of 0, whereas superpixels outside window 900 can have scale values of 0, 1, 2, etc. Superpixels may be congruent to a grid starting at (0,0) at that scale.

Calculation of the correct scale for can be split into a horizontal pass producing horizontal scale $s_x$ and a vertical pass producing vertical scale $s_y$.

FIG. 10 is a diagram showing the horizontal scale selection for each pixel in the image assuming window 900 has a left edge at pixel column index 5 (i.e., left window edge index L=5) and a right edge at pixel column index 27 (e.g., right window edge index R=27). As shown in FIG. 10, within the limits of the window edges, the horizontal scale $s_x$ is equal to the scale of the window (e.g., $s_x$=0 for L≤x≤R). Outside the window edges, the horizontal scale $s_x$ can be given by: (1) the index of the most significant bit of the logic exclusive OR of x and L if x is less than L, or (2) the index of the most significant bit of the logic exclusive OR of x and R if x is greater than R. In other words, the scale for each of the square superpixels outside window 900 can be computed using a logic exclusive OR function of a current pixel location and a nearest boundary of window 900.

FIG. 11 is a diagram showing the vertical scale selection for each pixel in the image assuming window 900 has a top edge at pixel row index 3 (i.e., top window edge index T=3) and a bottom edge at pixel row index 17 (e.g., bottom window edge index B=17). As shown in FIG. 11, within the limits of the window edges, the horizontal scale su is equal to the scale of the window (e.g., $s_y$=0 for T≤y≤B). Outside the window edges, the vertical scale $s_y$ can be given by: (1) the index of the most significant bit of the exclusive OR of y and T if y is less than T, or (2) the index of the most significant bit of the exclusive OR of y and B if y is greater than B.

Inside the horizontal and vertical boundaries of a window, which corresponds to a high-resolution region, a low scale value is needed. Thus, when combining scale calculations for a single window, the scale of the window $s_w$ should be equal to the greater of $s_x$ and $s_y$. When considering multiple windows, however, the lowest scale is needed. Thus, when considering a set of N windows, the overall scale should be equal to the minimum of $(s_{w1}, s_{w2}, \ldots, s_{wN})$. In other words, the superpixel size within each window should be less than or equal to the assigned resolution of that window. The scale value can be used to control the binning level selection circuit (e.g., to determine when to output S0, S1, S2, S3, etc.).

As described above, the encoded VRIF data stream can be transmitted to one or more host subsystems 20. A host subsystem 20 may include a decoder configured to decode the encoded VRIF data stream. The decoder may analyze the size, scale, and position of each superpixel and reconstruct an image as it arrives. For example, the decoder can generate a composite image having individual windows at different but constant resolution (e.g., the transmitted image can be decoded and viewed as a whole picture). If desired, the desired windows of interest can be separately extracted at their different resolutions. The foregoing is merely illustrative of the principles of this invention and various modifications can be made by those skilled in the art. The foregoing embodiments may be implemented individually or in any combination.

What is claimed is:

1. An imaging system comprising:
   an image sensor configured to capture an image; and
   an encoding circuit configured to:
      receive unbinned pixel data generated based on the image from the image sensor; and
      encode the unbinned pixel data in accordance with a variable resolution image format that specifies a number of windows in the image, a resolution for each of the windows, and edges for each of the windows, wherein different portions of the image are populated by square superpixels of different sizes, wherein the size of the square superpixels within each window is less than or equal to the resolution of that window, and wherein each square superpixel has only one data value that is output from the encoding circuit.

2. The imaging system of claim 1, wherein the encoding circuit comprises:
   a downsampling logic circuit configured to generate the square superpixels from the unbinned pixel data.

3. The imaging system of claim 2, wherein the downsampling logic circuit comprises:
   a plurality of logic sub-circuits each of which includes a delay circuit, a first adder circuit, and a second adder circuit coupled together in a chain.

4. The imaging system of claim 2, wherein the encoding circuit further comprises:
   a plurality of memory circuits configured to store binned pixel values generated by the downsampling logic circuit.

5. The imaging system of claim 2, wherein the downsampling logic circuit comprises a plurality of logic sub-circuits each of which includes a delay circuit, a first adder circuit, and a second adder circuit coupled together in a chain, and wherein the encoding circuit further comprises a plurality of memory circuits configured to store binned pixel values generated by the downsampling logic circuit.

6. The imaging system of claim 5, wherein the plurality of memory circuits comprises:
   a first memory circuit of a first size;
   a second memory circuit of a second size equal to half of the first size; and
   a third memory circuit of a third size equal to half of the second size.

7. The imaging system of claim 5, wherein the encoding circuit further comprises:
   a binning level selection circuit configured to generate a variable resolution image in accordance with the variable resolution image format and to determine a scale for each of the square superpixels.

8. The imaging system of claim 7, wherein the scale for each of the square superpixels in a given one of the windows is equal to an integer, and wherein the scale for each of the square superpixels outside the given one of the windows is greater than or equal to the integer.

9. The imaging system of claim 8, wherein the scale for each of the square superpixels outside the given one of the windows is computed using a logic exclusive OR function of a current pixel location and a nearest boundary of the given one of the windows.

10. The imaging system of claim 7, wherein the encoding circuit further comprises:
    a rate adaptation first-in-first-out circuit configured to receive the variable resolution image from the binning level selection circuit.

11. The imaging system of claim 1, wherein regions of the image outside the windows have a minimum resolution value and wherein each of the windows has a resolution value greater than the minimum resolution value.

12. A method of operating an imaging system, comprising:
    using an image sensor to capture an image;
    using an encoder to receive unbinned pixel data generated based on the image captured by the image sensor;

using the encoder to encode the unbinned pixel data by binning the unbinned pixel data into superpixels, wherein a first group of the superpixels corresponds to a first window of a first resolution, wherein a second group of the superpixels corresponds to a second window of a second resolution different than the first resolution, and wherein a third group of the superpixels outside the first and second windows has a third resolution that is less than the first and second resolutions; and transmitting a variable resolution image represented by the superpixels to an external system.

13. The method of claim 12, wherein the superpixels are square superpixels.

14. The method of claim 12, wherein transmitting the variable resolution image comprises transmitting only one value for each of the superpixels.

15. The method of claim 12, wherein:
the first and second windows are part of a plurality of demand windows;
transmitting the variable resolution image comprises transmitting only one value for each of the superpixels within the plurality of demand windows; and
no values are transmitted by the imaging system for superpixels outside the plurality of demand windows.

16. The method of claim 14, wherein the superpixels in the third group are larger than the superpixels in the first and second groups.

17. The method of claim 12, wherein transmitting the variable resolution image comprises transmitting a total number of windows, a resolution for each of the windows, and boundary locations for each of the windows.

18. The method of claim 12, wherein transmitting the variable resolution image comprises transmitting the variable resolution image for storage on the external system.

19. An apparatus comprising:
a downsampling logic circuit configured to receive a source image and to generate a plurality of superpixel values by recursively binning pixels into lower resolution regions of the source image;
memory circuits configured to store horizontally binned values that are used to generate the plurality of superpixel values; and
a binning level selection circuit configured to construct a variable resolution image based on at least the superpixel values, wherein the variable resolution image is transmitted in its entirety to an external device in the form of an output stream.

20. The apparatus of claim 19, wherein the variable resolution image is represented by an image pyramid comprising a number of resolution levels, and wherein each of the resolution levels represents a varying resolution of the source image.

21. The apparatus of claim 20, wherein the binning level selection circuit is configured to:
select a resolution level according to the source image; and
receive the superpixel values associated with the selected resolution level.

22. The apparatus of claim 19, wherein the output stream comprises a plurality of region identifiers, and wherein each region identifier is a value indicating a resolution and location of each region.

23. The apparatus of claim 19, wherein the plurality of superpixel values correspond to a plurality of square superpixels of different sizes.

24. The apparatus of claim 19, wherein at least some of the superpixel values are selected for output, and wherein the at least some of the superpixels values that are selected for output are appended to the output stream as soon as they are available.

25. The apparatus of claim 19, wherein the apparatus is part of an imaging system for a vehicle.

* * * * *